United States Patent [19]

Kameya

[11] Patent Number: 4,642,588
[45] Date of Patent: Feb. 10, 1987

[54] METHOD FOR ADJUSTMENT OF VARIABLE DELAY LINE

[75] Inventor: Kazuo Kameya, Tsurugashima, Japan
[73] Assignee: Elmec Corporation, Saitama, Japan
[21] Appl. No.: 612,915
[22] Filed: May 22, 1984
[30] Foreign Application Priority Data
  May 26, 1983 [JP] Japan .................. 58-94347
[51] Int. Cl.⁴ ............................ H01P 9/00; H03H 7/34
[52] U.S. Cl. ................................ 333/139; 333/140;
  333/161
[58] Field of Search .................. 333/138–140,
  333/156–164, 245, 248, 23

[56] References Cited

U.S. PATENT DOCUMENTS

| | | | |
|---|---|---|---|
| 2,961,620 | 11/1960 | Sommers | 333/161 |
| 3,238,300 | 3/1966 | Bopp et al. | 333/139 X |
| 3,584,376 | 6/1971 | Howe et al. | |
| 3,585,535 | 6/1971 | Seal | 333/161 |
| 3,656,179 | 4/1972 | De Loach | 333/161 |
| 3,781,722 | 12/1973 | Pierson | 333/156 |
| 4,160,220 | 7/1979 | Stachejko | 333/246 X |
| 4,507,628 | 3/1985 | Kameya | 333/138 |
| 4,525,691 | 6/1985 | Kameya | 333/139 |

OTHER PUBLICATIONS

Data Delay Devices, Inc., Catalog No. 82A; pp. 12 & 13.

*Primary Examiner*—Marvin L. Nussbaum
*Attorney, Agent, or Firm*—Wegner & Bretschneider

[57] ABSTRACT

This invention aims to provide a method of adjustment for a variable delay line which is provided with two delay line elements of dissimilar delay times and switch means capable of selectively switching from one to the other of the two delay line elements and adapted to enable the delay time to be digitally increased or decreased by the delay time difference produced by the selective switching between the delay time elements. This method allows the delay time to be finely adjusted with high accuracy of the order of 1 to some tens of ps by changing the delay time of either of the two delay line elements which has a smaller delay time than the other.

4 Claims, 5 Drawing Figures

METHOD FOR ADJUSTMENT OF VARIABLE DELAY LINE

BACKGROUND OF THE INVENTION (1) Field of the Invention

This invention relates to a method for the adjustment of a variable delay line, and more particularly to a method for fine adjustment of a variable delay line, capable of digitally varying a delay time in an ultra-high speed signal having a rise time of not more than 1 ns.

(2) Description of the Prior Art

Among the conventional variable delay lines for digital variation of delay time, there is counted a type which is so configured that by the use of switch means capable of selectively switching between a delay line element possessing a predetermined time aand a signal wiring presumably involving no delay time, the delay time difference between the above delay line element and the signal wiring will be digitally varied.

The adjustment of the value of variation in the delay time in such a variable delay line as described above is effected by increasing or decreasing, by an amount of the order of about 1 ns, the delay time of the former delay line element which possesses a predetermined delay time.

The recent advent of semiconductor devices capable of passing ultra-high speed signals have been encouraging actual adoption of ultra-high speed signals having a rise time of not more than 1 ns. In the circumstance, variable delay lines have been urged to fill the requirement that they should permit fine division of variable steps of delay time and highly accurate adjustment of values of variation proper to the fine division. For example, the accuracy of adjustment is required to be as high as the order of 1 to some tens of ps.

Since the aforementioned variable delay line mostly uses a delay line element of the lumped-constant type possessing a plurality of sections it is capable of permitting only rough adjustment of delay time and is hardly capable of providing accurate fine adjustment of the value of variation.

SUMMARY OF THE INVENTION

This invention has been perfected to fulfil such deficient status of prior art as described above.

An object of this invention is to facilitate accurate adjustment of the delay time difference involved in the switching between two delay line elements of dissimilar delay times and enhance the accuracy of variation.

Another object of this invention is to provide the arrangement of delay line elements and the adjustment of delay time with improved efficiency.

Yet another object of this invention is to promote simplification of the selection and adjustment of an accurate delay time difference in the configuration of a variable delay line by the cascade connection of a plurality of unit blocks each consisting of two delay line elements and one switch means.

To accomplish the objects described above, this invention contemplates configuring a variable delay line provided with two delay line elements of dissimilar delay times and one switch means capable of selectively switching from one to the other of the two delay line elements and adapted to increase or decrease the delay time by a delay time difference produced by the selective switching between the two delay line elements and, therefore, permits fine adjustment of the delay time difference by varying the delay time of either of the two delay line elements which has a smaller delay time than the other.

Owing to the construction of this invention described above, the delay time difference arising in the switching between the two delay line elements of dissimilar delay times can be easily and accurately adjusted and the variation of delay time can be accurately and rationally effected.

When the variable delay line is configured by the cascade connection of a plurality of unit blocks each consisting of two delay line elements and one switch means, the present invention enables the delay times arising in the individual unit blocks to be automatically synthesized accurately into one overall delay time and promotes simplification of adjustment.

The other objects and advantages of this invention will become apparent from the further disclosure of this invention to be made in the following detailed description of a preferred embodiment, with reference to the accompanying drawings.

DETAILED DESCRIPTION OF THE PREFERRED EMBODIMENT

Now, this invention will be described in detail below.

Figure 1:
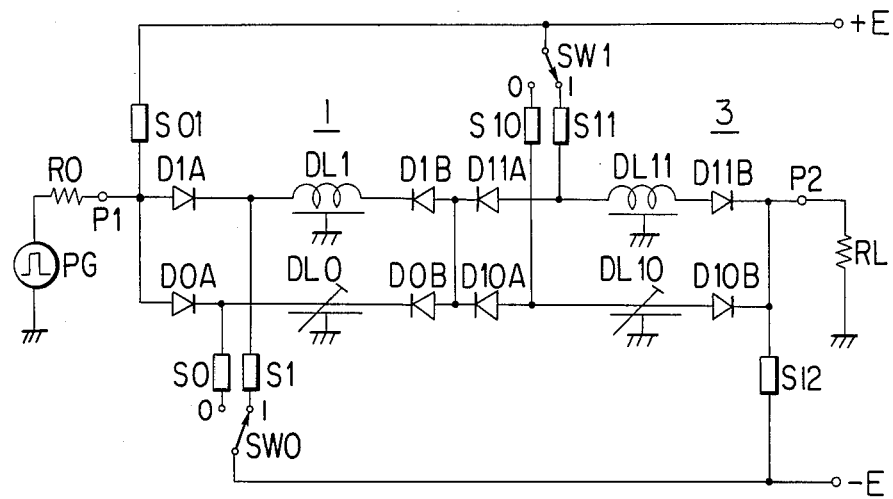
FIG. 1 is a circuit diagram of a variable delay line suitable for working a method for the adjustment according to the present invention.

In FIG. 1, a variable delay line is formed by the cascade connection of two delay line blocks 1, 3.

The delay line block 1 is formed by parallelly connecting a circuit obtained by serially connecting the cathodes of diodes D1A, D1B to the opposite ends of an electromagnetic delay line element DL1 and a circuit obtained by serially connecting the cathodes of diodes D0A, D0B to the opposite ends of a delay line element DL0 having a smaller delay time than the delay line element DL1.

Figure 2:
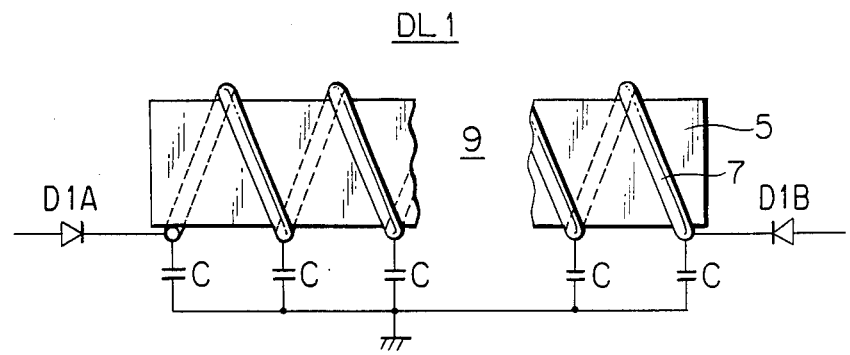
FIG. 2 is a schematic front view illustrating a typical delay line element of a large delay time in the variable delay line of FIG. 1.

The delay line element DL1 is formed, as illustrated in FIG. 2, of an inductance element 9 having a conductor 7 wound as spaced in the shape of a single-layer solenoid around a bar-shaped bobbin 5 of a square cross section and capacitors C interconnecting the conductor 7 and the earth at intervals of a predetermined number of turns of the conductor 7.

Figure 3:
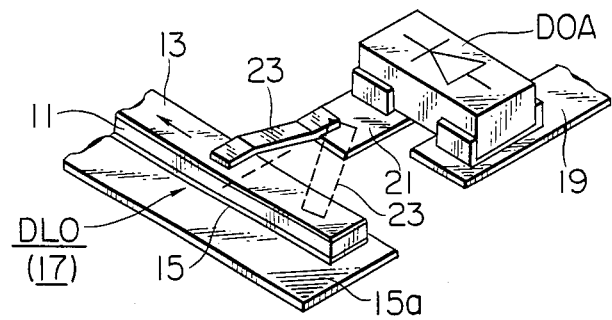
FIG. 3 is a schematic perspective view illustrating a typical delay line element of a small delay time in the delay line of FIG. 1 and a typical adjustment of the delay time according to the present invention.

The delay line element DL0 is formed, as illustrated in FIG. 3, of a microstrip conductor 13 disposed on one main surface of a flat slender dielectric plate 11 and a microstrip line 17 constituting a grounding electrode 15 and deposited on the other main surface of the dielectric plate 11. The symbol 15a denotes a grounding plate concurrently serving as a support member for the microstrip line 17.

The delay line block 3 is formed by parallelly connecting a circuit obtained by serially connecting the anodes of diodes D11A, D11B to the opposite ends of a delay line element DL11 substantially resembling the delay line element DL1 and a circuit obtained by serially connecting the anodes of diodes D10A, D10B to the opposite ends of a delay line element D10 substantially resembling the delay line element DL0 and having a smaller delay time than the delay line element DL11.

The delay line blocks 1, 3 are disposed so relative to each other that the diodes D0B, D1B, D10A, and D11A of the adjoining delay line blocks 1, 3 are mutually joined in a cascade connection in the forward direction, and the delay line block 1 is positioned on the input side and the delay line block 3 on the output side.

The anodes of the diodes D1A, D0A of the delay line block 1 are mutually joined and connected via a resistor S01 to a power source +E and also connected to an input terminal P1. To the input terminal P1 is connected a pulse generator PG possessing a prescribed impedance Ro. One end (on the diode D1A side) of the delay line element DL1 in the delay line block 1 is connected via a resistor S1 to a stationary contact (1) of a solid-state switch SW0 and one end (on the diode D0A side) of the delay line element DL0 is connected via a resistor S0 to a stationary contact (0) of the solid-state switch SW0. A movable contact of the solid-state switch SW0 is connected to the power source −E.

One end (on the diode D11A side) of the delay line element DL11 in the delay line block 3 of the next stage is connected via a resistor S11 to a stationary contact (1) of the solid-state switch SW1 and one end (on the diode D10A side) of the delay line element DL10 is connected via a resistor S10 to a stationary contact (0) of the solid-state swtich SW1. A movable contact of this solid-state switch SW1 is connected to the power source +E.

The cathodes of diodes D11B, D10B of the delay line block 3 are mutually joined and connected via a resistor S12 to the power source −E and also connected to an output terminal P2. To the output terminal P2 is connected a load resistor RL as a load.

The variable delay line configured as described above operates as follows.

First with reference to FIG. 1, the case in which the movable contacts of the solid-state switch SW0, SW1 are connected to one stationary contact (1) will be described.

The electric current which has flowed through the resistor S01 advances to the diode D1A and the resistor S1. The electric current which flows through the resistor S11 is branched and part of the electric current flows via the diodes D11A, D1B and the delay line element DL1 to the resistor S1. Consequently the electric current flows in a combined form to the resistor S1.

The remaining part of the electric current branched from the electric current flowing through the resistor S11 flows via the delay line element DL11 and the diode D11B to the resistor S12.

In the condition described above, the diodes D1A, D1B, D11A, and D11B assume the ON status and the diodes D0A, D0B, D10A, and D10B assume the OFF status respectively in the delay line blocks 1, 3. Consequently, the signal applied from the pulse generator PG to the input terminal P1 is passed through the delay line elements DL1, DL11 and is fed out of the load resistor RL as accompanied by the delay times arising in the delay line elements DL1, DL11.

Now, when the movable contacts of the solid-state switches SW0, SW1 are connected to the other stationary contact (0), the electric current flowing through the resistor S01 advances to the diode D0A and the resistor S0. The electric current flowing through the resistor S10 is branched and part of the electric current flows through the diodes D10A, D0B and the delay line element DL0 to the resistor S0. Consequently, the electric current flows in a combined form to the resistor S0.

The remaining part of the electric current branched from the electric current flowing through the resistor S10 advances via the delay line element DL10 and the diode D10B to the resistor S12.

Consequently, the diodes D1A, D1B. D11A, and D11B assume the OFF status and the diodes D0A, D0B, D10A, and D10B assume the ON status respectively in the delay line blocks 1, 3.

As the result, the input signal from the pulse generator PG is passed through the delay line elements DL0, DL10 and is fed out as accompanied by a small delay time.

When the movable contact of the solid-state switch SW0 is connected to the stationary contact (1) and, at the same time, the movable contact of the solid-state switch SW1 is connected to the stationary contact (0), the diodes D1A, D1B, D10A, and D10B assume the ON status and the diodes D0A, D0B, D11A, and D11B assume the OFF status respectively in the delay line blocks 1, 3. The input signal from the pulse generator PG, therefore, is passed through the delay line elements DL1, DL10 and fed out.

By the same token, when the movable contact of the solid-state switch SW0 is connected to the stationary contact (0) and the movable contact of the solid-state switch SW1 is connected to the stationary contact (1), the operation which ensues may be easily inferred.

In the variable delay line configured as described above, therefore, the delay time can be digitally varied by causing the solid-state switches SW0, SW1 to be switched with a two-bit binary digiral control signal as described below.

With reference to the delay line elements DL0, DL1, DL10, and DL11, for example, the delay times including the inductance of the diodes D0A through D11B connected to the opposite ends of the delay line elements are denoted by TD0, TD1, TD10, and TD11. The side on which the solid-state switches SW0, SW1 select the stationary contact (0) is made to correspond to the two-bit binary code "0" and the side on which they select the stationary contact (1) to correspond to the two-bit binary code "1." Further, the solid-state switch SW0 is made to correspond to the least significant bit of the two-bit binary code and the solid-state switch SW1 to the most significant bit.

As regards the output signal which have been fed in the input terminal P1 and fed out of the output terminal P2, let TD (00), TD (01), TD (10), and TD (11) stand for the delay times corresponding to the two-bit binary digital control signal "00," "01," "10," and "11" and the following equations will be satisfied.

$$TD\ (00) = TD0 + TD10 \tag{1}$$

$$TD\ (01) = TD1 + TD10 \tag{2}$$

$$TD\ (10) = TD0 + TD11 \tag{3}$$

$$TD\ (11) = TD1 + TD11 \tag{4}$$

When the delay time TD (00) for the digital control signal "00" is taken as the standard and ΔTD (01) is taken as designating an incremental delay time for the signal "01," ΔTD (10) an incremental delay time for the signal "10," and ΔTD (11) an incremental delay time for the signal "11," respectively, then ΔTD (01) through ΔTD (11) will be developed from the aforementioned formulas (1) through (4) as follows.

$$\Delta TD\ (01) = TD\ (01) - TD\ (00) \quad (5)$$
$$= TD1 - TD0$$
$$\Delta TD\ (10) = TD\ (10) - TD\ (00) \quad (6)$$
$$= TD11 - TD10$$
$$\Delta TD\ (11) = TD\ (11) - TD\ (00) \quad (7)$$
$$= (TD1 - TD0) + (TD11 - TD10)$$
$$= \Delta TD\ (01) + \Delta TD\ (10)$$

From these formulas (5) through (7), it is noted that the digitally varied incremental delay time are not affected by the absolute values of the delay times TD0 through TD11 of the delay line elements DL0 through DL11 but are determined by the differences between the delay times TD1, TD11 of the delay line elements DL1, DL11 and the delay times TD0, TD10 of the delay line elements DL0, DL10 arranged parallelly thereto.

First, by the method of fine adjustment to be described below, the delay time TD0 of the delay line element DL0 in the formula (5) is adjusted with respect to the value Δtd of the incremental delay time destined to serve as one standard so that ΔTD (01) will exactly assume the value Δtd.

Then, the delay time TD10 of the delay line element DL10 in the formula (6) is similarly adjusted so that ΔTD (10) will exactly assume the value 2 Δtd. Consequently, ΔTD (11) of the variable delay line will exactly assume the value 3 Δtd in accordance with the formula (7).

Thus, in the variable delay line of the two-bit binary system, the synthesized delay time TD11 is accurately determined automatically by accurately adjusting the delay time differences in the two sets of delay line blocks 1, 3. Consequently, the accuracy with which the delay times are varied by external digital control signal is notably improved.

One method for the fine adjustment of the delay time in the microstrip line 17 forming the delay line elements DL0, DL10 is depicted in FIG. 3.

A mini-molded diode D0A, for example, is soldered between conductor patterns 19, 21 and, at the same time, a connecting piece 23 is extended from the conductor pattern 21 and allowed to move on a microstrip conductor 13 of the microstrip line 17 to change the position of contact of the conductor 13 with the connecting piece 23.

Since the delay time of the microstrip line 17 is proportional to the length of the line 17, the delay times TD0, TD10 can be finely adjusted by changing the position of connection as described above. For example, when the signal advances on the microstrip conductor 13 in the direction of the arrow, the movement of the connecting piece 23 in the direction of the travel of signal shortens the available length of the microstrip conductor 13, namely the length of the conductor through which the signal travels. Consequently, the delay time is shorter in this case than when the connecting piece 23 is held at the position indicated by a broken line in FIG. 3.

By adjusting the microstrip line 17 which has a small delay time, therefore, highly accurate fine adjustment on the order of 1 to some tens of ps can be effected.

If the connecting piece 23 is connected to the microstrip line 17 halfway along the entire length thereof, the occurrence of a portion of the line 17 which lies in the direction opposite the direction of travel of signal could cause mismatching. To avoid this trouble, therefore, the remaining portion of the line is desired to be cut off after the fine adjustment.

Further, since two delay line elements are parallelly connected and only one of them is subjected to adjustment, the disposition and the position of adjustment of the delay line elements are obtained with regularity. Thus, the variable delay line permits rationalization of the disposition and adjuctment of delay line elements. This effect of the present invention is especially conspicuous when the variable delay line is formed by the cascade connection of a plurality of delay line blocks.

FIG. 4 shows another method for the fine adjustment of the delay time of the microstrip line.

Figures 4A, 4B:
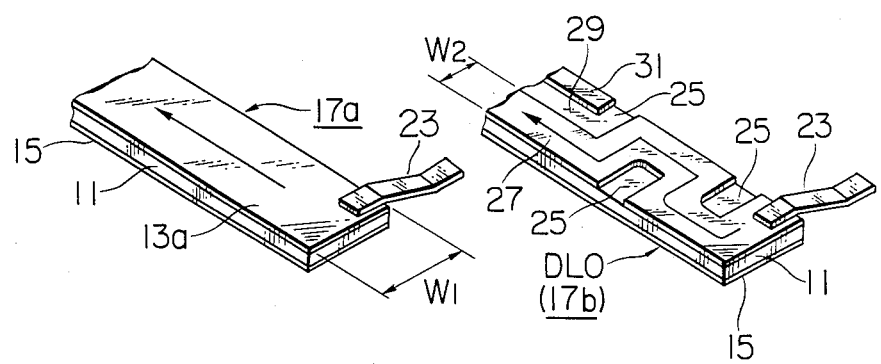
FIGS. 4(A) and (B) are schematic perspective views illustrating another method for the adjustment of delay time according to the present invention.

First, as illustrated in FIG. 4(A), a microstrip conductor 13a having a width W1 greater than the width of a microstrip conductor 13 capable of obtaining the characteristic impedance required by the microstrip line is formed on a dielectric plate 11 and a slightly shorter microstrip line 17a having a slightly smaller delay time is prepared.

Then, notches 25 of a shape as shown in FIG. 4(B) are cut in the microstrip conductor 13a by suitable known means such as the laser beam to form a zigzag microstrip conductor 27 and make to a microstrip line 17b.

Generally in the microstrip line, the delay time per unit length of the microctrip line relies solely on the dielectric constant of the dielectric and does not rely on the width of the microstrip line and the thickness of the dielectric. Thus the microstrip line possesses a delay time proportional to the length thereof.

When the microstrip conductor 27 is formed in a zigzag pattern as described above, the signal advances in the zigzag pattern. Consequently, the available length of the microstrip line 17b is increased and the delay time is proportionately lengthened. By suitably selecting the number of notches 25 and suitably fixing the length of these notches, therefore, the delay time of the microstrip line can be finely adjusted to a desired value.

The remaining portion of the microstrip line 17b which has undergone the fine adjustment described above has a width W1 greater than the width W2 and possesses a lower characteristic impedance. To acquire an equal characteristic impedance, therefore, this portion incorporated therein an additional notch 29 calculated to decrease the width W1 to the width W2.

If a conductor piece 31 remains on the microstrip line 17b, it will do no harm so far as it is kept electrically insulated from the line passing the signal. The width of the microstrip cnductor 27 passing the signal the zigzag pattern is desired to be equivalent to the width W2.

The method of this invention for the adjustment of a variable delay line has been described, for the sake of simplicity of explanation, as effecting fine adjustment by using two delay line blocks 1, 3 arranged in a cascade connection and adapted to be given switch control with two-bit binary control signal.

This invention can fulfil its objects even when it is worked on the variable delay line consisting of only one delay line block. It can be also carried out by the use of three or more delay line blocks arranged in a cascade connection and adapted to be given switch control with digital control signal of three or more bits. This invention enjoys the advantage that, compared with the number of delay line elements subjected to fine adjustment, the number of incremental delay time to be synthesized increases in proportion as the number of bits used in the control signal increases.

To be specific, while the number of delay line elements subjected to fine adjustment equals that of bits, the number of incremental delay time to be synthesized increases sharply from 3 for two bits, to 7 for three bits, 15 for four bits, 31 for five bits, 63 for six bits, and so on. As the number of bits is increased, so the accuracy of fine adjustment of the delay line elements is required to be enhanced. This fine adjustment can be simplified by the use of this invention.

In the embodiment of this invention given above, the delay line elements subjected to fine adjustment have been described as being formed of microstrip lines themselves. For the object of this invention, the delay line elements subjected to adjustment have only to fulfil the sole requirement that they should possess a small delay time. Incidentally, the adoption of microstrip lines offers the advantage that the delay time can be analogously adjusted. The delay line elements which are not subjected to adjustment are not necessarily limited to the concrete examples cited above.

The solid-state switches SW0, SW1 described above may be replaced with other switch means, such as mechanical two-circuit two-contact slide switches and high-frequency grade lead relays. Gates switching between the two delay line elements may be also used in the place of those switch means. As the resistors S01 through S12, constant-current circuits may be used, for example, in the place of those resistors indicated above. The adoption of such constant-current circuits proves is rather advantageous in the sense that the loss is diminished and, moreover, the characteristic changes due to a variation in the power source are repressed.

What is claimed is:

1. A method for the adjustment of a variable delay line, comprising:
    configuring a variable delay line with two delay line elements of dissimilar delay times, the element having the smaller delay time comprising a microstrip line with a conductor and the element having the larger delay time comprising an inductance element having a conductor wound in a plurality of turns in the shape of a solenoid and one or more capacitors interconnecting the conductor and the ground;
    selectively switching from one to the other of said two delay line elements to increase or decrease the delay time by a delay time difference produced by said selective switching between said two delay line elements; and
    varying the delay time of the delay line element which has the smaller delay time by selectively varying the effective physical length of the conductor to achieve a desired delay time.

2. A method for the adjustment of a variable delay line, comprising:
    configuring a variable delay line with two delay line elements of dissimilar delay times, the element having the smaller delay time comprising a microstrip line with a conductor;
    selectively switching from one to the other of said two delay line elements to increase or decrease the delay time by a delay time difference produced by said selective switching between said two delay line elements; and
    varying the delay time of the delay line element which has the smaller delay time by selectively varying the effective physical length of the conductor to achieve a desired delay time by notching the conductor.

3. A method for the adjustment of a variable delay line, comprising:
    configuring a delay line having joined on cascade connection a plurality of variable delay lines as unit blocks, each provided with two delay line elements of dissimilar delay times, the element having the smaller delay time comprising a microstrip line with a conductor and the element having the larger delay time comprising an inductance element having a conductor wound in a plurality of turns in the shape of a solenoid and one or more capacitors interconnecting the conductor and the ground;
    selectively switching from one to the other of said two delay line elements to increase or decrease the delay time by a delay time difference produced by said selective switching between said two delay line elements; and
    varying the delay time of the delay line element in each of said delay line blocks which has the smaller delay time by selectively varying the effective physical length of the conductor to achieve a desired delay time.

4. A method for the adjustment of a variable delay line, comprising:
    configuring a delay line having joined on cascade connection a plurality of variable delay lines as unit blocks, each provided with two delay line elements of dissimilar delay times, the element having the smaller delay time being a microstrip line with a conductor;
    selectively switching from one to the other of said two delay line elements to increase or decrease the delay time by a delay time difference produced by said selective switching between said two delay line elements; and
    varying the delay time of the delay line element in each of said delay line blocks which has the smaller delay time by selectively varying the effective physical length of the conductor to achieve a desired delay time by notching the conductor.

* * * * *